(12) United States Patent
Noguchi

(10) Patent No.: US 8,125,248 B2
(45) Date of Patent: Feb. 28, 2012

(54) SEMICONDUCTOR DEVICE, METHOD OF FABRICATING SEMICONDUCTOR DEVICE, AND SEMICONDUCTOR DEVICE LAYOUT METHOD

(75) Inventor: Hidekazu Noguchi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/855,858

(22) Filed: Aug. 13, 2010

(65) Prior Publication Data

US 2011/0057685 A1    Mar. 10, 2011

(30) Foreign Application Priority Data

Sep. 9, 2009 (JP) ................................ 2009-207991

(51) Int. Cl.
*H01L 25/00* (2006.01)

(52) U.S. Cl. .............. 326/103; 326/41; 326/47; 716/55; 716/121

(58) Field of Classification Search .................... 326/41, 326/47, 101–103; 716/55, 119, 121
See application file for complete search history.

(56) References Cited

U.S. PATENT DOCUMENTS

| | | | |
|---|---|---|---|
| 6,353,248 B1 * | 3/2002 | Reith et al. .................... 257/369 |
| 6,523,159 B2 * | 2/2003 | Bernstein et al. ............. 716/115 |
| 6,604,226 B2 * | 8/2003 | Thorp et al. ................... 716/136 |
| 6,608,365 B1 * | 8/2003 | Li et al. ......................... 257/532 |
| 6,763,509 B2 * | 7/2004 | Korobkov ...................... 716/122 |
| 7,222,320 B2 * | 5/2007 | Ogawa ........................... 716/115 |
| 7,358,555 B2 * | 4/2008 | Iwamatsu et al. ............. 257/296 |
| 7,600,208 B1 * | 10/2009 | Sharma et al. ................ 716/120 |
| 7,689,961 B2 * | 3/2010 | Braun et al. ................... 716/115 |
| 7,800,151 B2 * | 9/2010 | Mizushino et al. ........... 257/300 |
| 2004/0022006 A1 * | 2/2004 | Liao ............................ 361/301.1 |
| 2004/0073881 A1 * | 4/2004 | Nassif et al. .................... 716/10 |
| 2004/0139412 A1 * | 7/2004 | Ito et al. ............................ 716/8 |
| 2007/0252217 A1 * | 11/2007 | Oki ................................. 257/369 |
| 2010/0060322 A1 * | 3/2010 | Coenen ......................... 326/103 |

FOREIGN PATENT DOCUMENTS

JP    2007-299860    11/2007

* cited by examiner

Primary Examiner — Jason M Crawford

(74) Attorney, Agent, or Firm — Volentine & Whitt, PLLC

(57) ABSTRACT

There is provided a semiconductor device including: logic circuit elements disposed within a specific region in respective functional blocks of a logic circuit having a plurality of the functional blocks provided one for each functional unit; and a decoupling capacitor disposed in a region within each of the functional blocks at which no logic circuit element is disposed.

4 Claims, 8 Drawing Sheets

SEMICONDUCTOR DEVICE, METHOD OF FABRICATING SEMICONDUCTOR DEVICE, AND SEMICONDUCTOR DEVICE LAYOUT METHOD

CROSS-REFERENCE TO RELATED APPLICATION

This application is based on and claims priority under 35 USC 119 from Japanese Patent Application No. 2009-207991 filed on Sep. 9, 2009, the disclosure of which is incorporated by reference herein.

BACKGROUND

1. Technical Field

The present invention relates to a semiconductor device, a method of fabricating a semiconductor device, and a layout method of a semiconductor device. The present invention relates in particular to a semiconductor device provided with a decoupling capacitor, and method of fabricating a semiconductor device and semiconductor device layout method of the same.

2. Related Art

Decoupling capacitance is required in order to stabilize operation of a circuit of a semiconductor device, however gate capacitance and junction capacitance used in integrated circuits of a semiconductor device function as decoupling capacitance, and, since there is also parasitic capacitance present generated in lines connecting between elements, a degree of decoupling capacitance is secured.

However, due to demands due to improvements in miniaturization processing technology and lower power consumption in recent semiconductor devices, there is a tendency for the power source voltage of semiconductor devices to decrease, while the current consumption in semiconductor devices remains large due to the increasing scale of integrated circuits. There is a need to secure further decoupling capacitance when the power supply voltage is low, since sometimes there is a malfunction in circuit operation when, due to the operation current, the same level of voltage drop as previously occurs in power source lines.

There is a proposal for a semiconductor device to secure decoupling capacitance by provision of an extra cell(s) to give decoupling capacitance, separate from the basic cells to give elements to configure inverter circuits, NAND circuits, flip-flops and the like (see, for example, Japanese Patent Application Laid-Open (JP-A) No. 2007-299860.

However, there is a problem with the semiconductor device described in JP-A No. 2007-299860 in that the surface area of the semiconductor device is increased, due to provision of the extra cell(s), separate from the basic cells, in order to secure decoupling capacitance.

SUMMARY

The present invention addresses the above issue, and an object thereof is to provide a semiconductor device that can secure decoupling capacitance without increasing the surface area of the semiconductor device, and method of fabricating a semiconductor device and semiconductor device layout method of the same.

In order to achieve the above object, a first aspect of the present invention provides a semiconductor device including:

logic circuit elements disposed within a specific region in respective functional blocks of a logic circuit having a plurality of the functional blocks provided one for each functional unit; and a decoupling capacitor disposed in a region within each of the functional blocks at which no logic circuit element is disposed.

According to the semiconductor device of the present invention, logic circuit elements are disposed within a specific region in respective functional blocks of a logic circuit having plural of the functional blocks provided one for each functional unit, and a decoupling capacitor is disposed in a region within the functional block where no logic circuit element is disposed.

Accordingly, due to the decoupling capacitor being disposed in a region within the functional block where no logic circuit element is disposed, without providing a separate region for disposing the decoupling capacitor, a decoupling capacitance can be secured without increasing the surface area of the semiconductor device.

A second aspect of the present invention provides the semiconductor device the first aspect, wherein the decoupling capacitor is shaped to correspond to an outline contour of the logic circuit elements, shaped to correspond to an outline contour designating the region of each of the functional blocks, or shaped with a portion corresponding to the outline contour of the logic circuit elements and a portion corresponding to the outline contour of the region of each of the functional blocks.

A third aspect of the present invention provides the semiconductor device of the first aspect, wherein the functional blocks are partitioned along a first direction into a PMOS region where P-type MOS elements are disposed as the logic circuit elements, and an NMOS region where N-type MOS elements are disposed as the logic circuit elements, and the P-type MOS elements and the N-type MOS elements are disposed so as to face each other along a second direction orthogonal to the first direction.

A fourth aspect of the present invention provides the semiconductor device of claim 1, wherein a plurality of the P-type MOS elements of a plurality of sizes are disposed in the PMOS region, and a plurality of the N-type MOS elements of a plurality of sizes are disposed in the NMOS region.

In a CMOS integrated circuit in which the P-type MOS elements and the N-type MOS elements are disposed facing each other, due to the P-type MOS elements and the N-type MOS elements within the functional block being of various sizes, the region in the functional block where there are no P-type MOS elements or N-type MOS elements disposed becomes bigger, particularly in portions where small sized P-type MOS elements and N-type MOS elements are disposed. Consequently, a greater effect is obtained by applying the present invention to a semiconductor device of such a configuration.

A fifth aspect of the present invention provides the semiconductor device of the third aspect, wherein a ground line and a power source line extend along the first direction over the PMOS region and over the NMOS region, respectively, and the decoupling capacitor is connected to the ground line and to the power source line over each of the corresponding regions.

A sixth aspect of the present invention provides the semiconductor device of the third aspect, wherein the decoupling capacitor is formed by a gate electrode and an impurity region facing the gate electrode, and a P-type MOS capacitor is disposed in the PMOS region, and an N-type MOS capacitor is disposed in the NMOS region.

A seventh aspect of the present invention provides the semiconductor device of the sixth aspect, wherein the P-type MOS capacitor and the N-type MOS capacitor are formed such that, in a facing portion of the P-type MOS element or the N-type MOS element to the gate electrode, the impurity region projects out further to the P-type MOS element side or the N-type MOS element side than the gate electrode, and in a facing portion of the P-type MOS element or the N-type MOS element to the impurity region, the gate electrode projects out further to the P-type MOS element side or the N-type MOS element side than the impurity region.

Accordingly, the surface area of the MOS capacitor can be increased to the maximum while preventing the gate electrodes and the impurity regions from getting too close to each other and shorting between elements, and decoupling capacitance can be more effectively secured.

In order to achieve the above object, an eighth aspect of the present invention provides a method of fabricating a semiconductor device including:

disposing logic circuit elements within a specific region of each functional block of a logic circuit with a plurality of the functional blocks provided one for each functional unit; and disposing a decoupling capacitor in a region within each of the functional blocks at which no logic circuit element is disposed.

In order to achieve the above object, a ninth aspect of the present invention provides a layout method of a semiconductor device including:

determining a placement position of logic circuit elements disposed within a specific region in respective functional blocks of a logic circuit with a plurality of functional blocks provided one for each functional unit; and determining, as a placement position of a decoupling capacitor, a region surrounded by an outline contour, separated to the outside from an outline contour of the logic circuit elements whose placement position has been determined by a predetermined logic circuit element isolation distance amount, and by a frame designating the region of the functional block.

As explained above, according to the semiconductor device, the method of fabricating the semiconductor device, and the semiconductor device layout method of the present invention, due to the decoupling capacitor being disposed within a region representing the functional block in which there are no logic circuit elements disposed, decoupling capacitance can be secured without increasing the surface area of the semiconductor device.

BRIEF DESCRIPTION OF THE DRAWINGS

Exemplary embodiments of the present invention will be described in detail based on the following figures, wherein.

DETAILED DESCRIPTION

Explanation follows of an exemplary embodiment of the present invention, with reference to the drawings.

Figure 1:
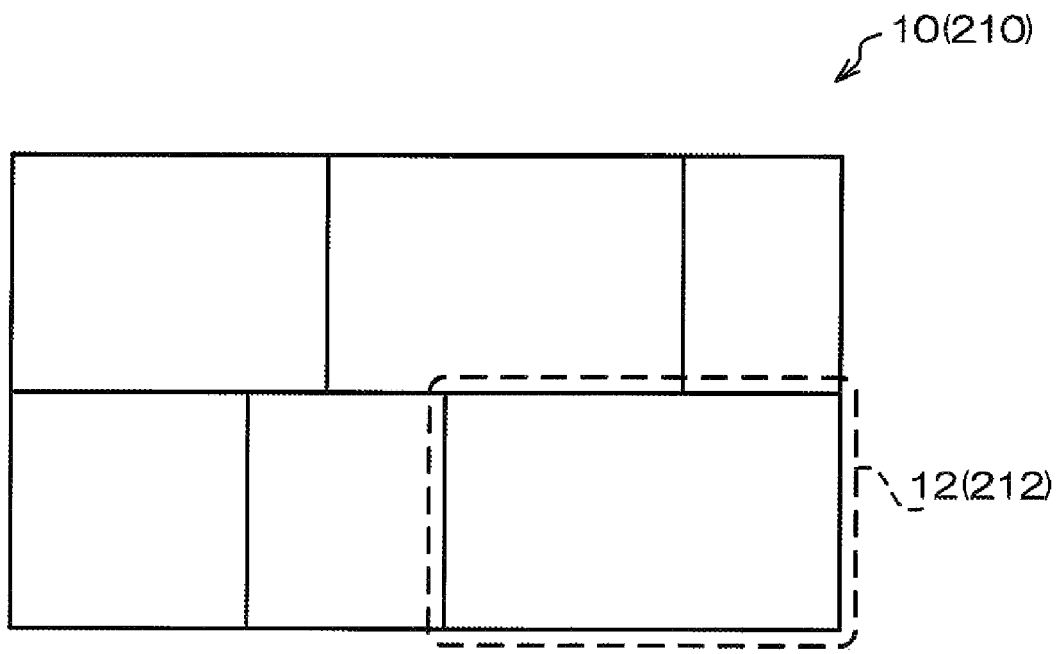
FIG. 1 is a partial plan view showing an outline of a semiconductor device of the present exemplary embodiment.

FIG. 1 shows a partial plan view of a semiconductor device 10 of a first exemplary embodiment. The semiconductor device 10 is provided with plural individual functional blocks 12, one for each of the functional units, as shown in FIG. 1.

Figure 2:
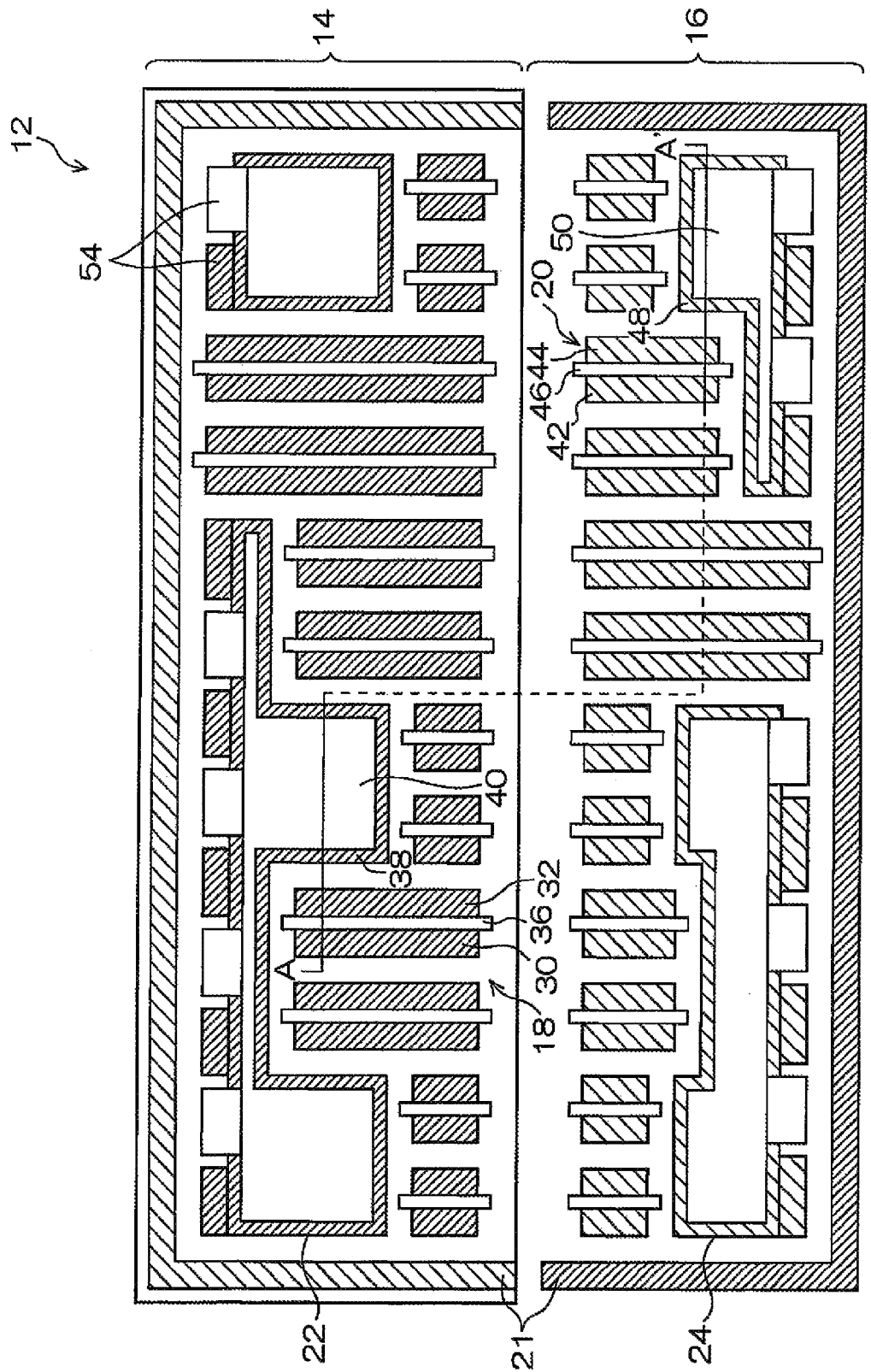
FIG. 2 is a plan view showing an outline of a single functional block of a semiconductor device of a first exemplary embodiment.

FIG. 2 shows a plan view of one of the functional blocks 12. In FIG. 2, interlayer insulating film, wiring and the like, formed over the semiconductor elements, is omitted in the drawing. The functional block 12 is partitioned into a PMOS region 14 and an NMOS region 16, with plural P-type MOS-FETs 18 disposed in the PMOS region 14, and plural N-type MOS-FETs 20 disposed in the NMOS region 16. The P-type MOS-FETs 18 and the N-type MOS-FETs 20 disposed facing each other and form a CMOS integrated circuit. A substrate potential power supply diffusion layer 21, for supplying power at the substrate potential, is also disposed on a peripheral edge portion of the functional block 12, The P-type MOS-FETs 18 and the N-type MOS-FETs 20 are disposed so as to be parallel to the vertical direction, when viewed with the partitioning direction of the PMOS region 14 and the NMOS region 16 as the horizontal direction. There are various sizes for the P-type MOS-FETs 18 and the N-type MOS-FETs 20, with the size of the P-type MOS-FETs 18 and the N-type MOS-FETs 20 employed for exchanging signals within functional blocks 12 often being smaller than the size of the P-type MOS-FETs 18 and the N-type MOS-FETs 20 employed in exchanging signals with another of the functional blocks 12.

Note that the P-type MOS-FETs 18 disposed within the PMOS region 14 may all be of a different size, or plural sets may be disposed therein with each set having P-type MOS-FETs 18 of different respective sizes, or plural sets may be disposed therein with each set having P-type MOS-FETs 18 of the same size, such that a plurality of P-type MOS-FETs 18 of various different sizes are disposed. Similar applies to the N-type MOS-FETs 20 disposed within the NMOS region 16.

In order to simplify wiring when forming the CMOS integrated circuit, the P-type MOS-FETs 18 and the N-type MOS-FETs 20 are preferably disposed facing each other, packed towards the partitioned portions of the PMOS region 14 and the NMOS region 16, namely towards the inside of the functional block 12. By so doing, there are empty regions, where the P-type MOS-FETs 18 and the N-type MOS-FETs 20 are not disposed, present in each of the PMOS region 14 and the NMOS region 16 at regions thereof at the opposite sides, respectively, to the facing regions of the P-type MOS-FETs 18 and the N-type MOS-FETs 20, namely there are empty regions at the outside of the functional block. The surface area of the empty regions is larger, in particular, at locations where small sized P-type MOS-FETs 18 and N-type MOS-FETs 20 are employed.

Decoupling capacitors are disposed in these empty regions. P-type MOS capacitors 22 are employed as decoupling capacitors disposed in the PMOS region 14, and N-type MOS capacitors 24 are employed as decoupling capacitors disposed in the NMOS region 16. The MOS capacitors are preferably formed so as to fill the entire empty regions, since the larger the surface area of a MOS capacitor the larger the decoupling capacitance value that can be obtained.

Specifically, the P-type MOS capacitors 22 are preferably formed in the empty region surrounding the P-type MOS-FETs 18 in a shape corresponding to the outline contour of the P-type MOS-FETs 18, The P-type MOS capacitors 22 are preferably formed in the region surrounded by the outline contour designating the region of the functional block 12 in a shape corresponding to the outline contour designating the region of the functional block 12. The P-type MOS capacitors 22 are preferably formed in the empty region surrounded by the outline contour of the P-type MOS-FETs 18 and outline contour designating the functional block 12 in a shape provided with a portion corresponding to the outline contour of the P-type MOS-FETs 18 and a portion corresponding to the outline contour designating the region of the functional block 12. Similar applies to the N-type MOS capacitors 24, with the N-type MOS capacitors 24 preferably formed in a shape corresponding to the outline contour of the N-type MOS-FETs 20 and the outline contour designating the region of the functional block 12.

The outline contour of the P-type MOS-FETs 18 and the N-type MOS-FETs 20 can be configured as an outline contour at a required separation distance from the outline contour of the P-type MOS-FETs 18 and the N-type MOS-FETs 20, at the outside of the P-type MOS-FETs 18 and the N-type MOS-FETs 20. Details regarding the required separation distance are given in the layout method described below.

Figure 3:
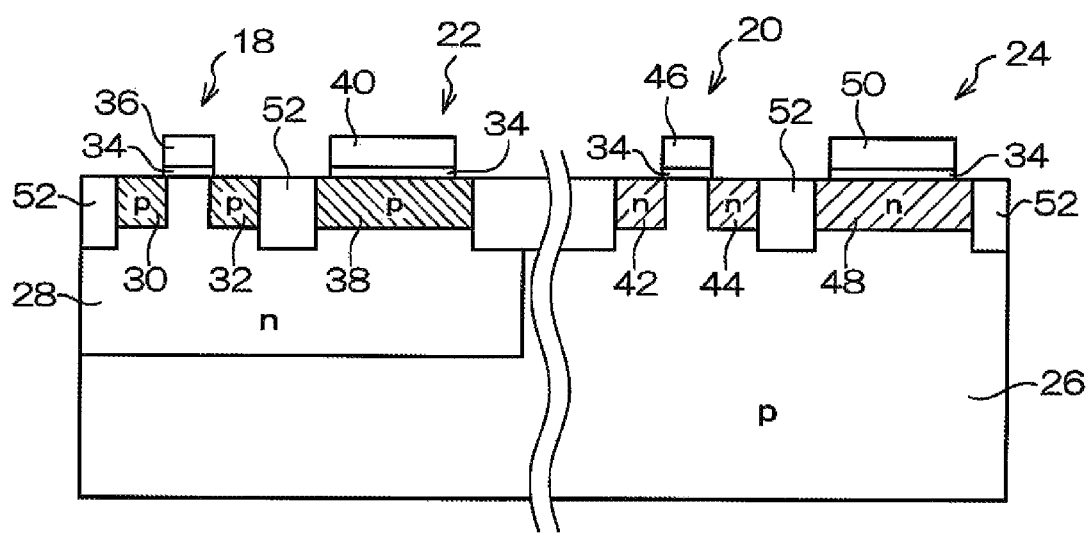
FIG. 3 is a cross-section schematically showing a cross-section taken on line A-A' of FIG. 2.

A cross-section taken on line A-A' of FIG. 2 is shown in FIG. 3. In the semiconductor device 10, a P-type P well 26 is formed by the P-type substrate, and an N-type N well 28 is formed to a region that is part of the P well 26. Note that configuration may also be made with an N-type N well formed by an N-type substrate and a P-type P well formed to a region that is part of the N well.

In the N well 28, P-type impurity regions are formed with a P-type impurity implanted at high concentration, these forming a source 30 and a drain 32 of the P-type MOS-FET 18. A channel region is formed between the source 30 and the drain 32 of the P-type MOS-FET 18, and a gate electrode 36 for controlling current flowing in the channel region is provided on this channel region, with a gate insulating film 34 interposed therebetween. The source 30 of the P-type MOS-FET 18 is connected to a power source line, the drain 32 is connected to the drain of the facing N-type MOS-FET 20, and the gate electrode 36 is connected to the gate electrode of the facing N-type MOS-FET 20.

Figure 4A:
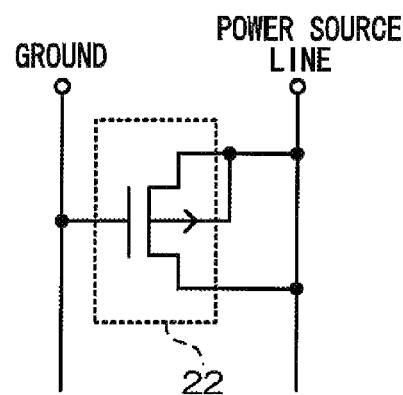
FIG. 4A is a circuit diagram showing a circuit diagram of a P-type MOS capacitor portion.
Figure 4B:
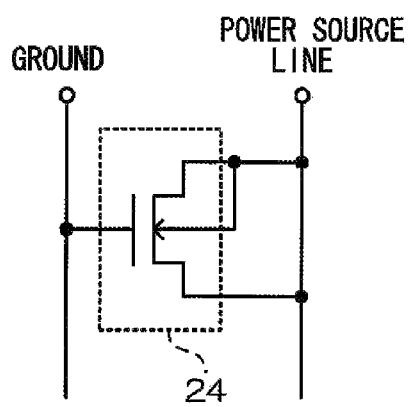
FIG. 4B is a circuit diagram of an N-type MOS capacitor portion.
Figure 4C:
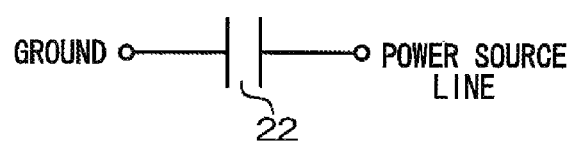
FIG. 4C is an equivalent circuit of a P-type MOS capacitor portion.

A diffusion layer 38 of the P-type MOS capacitor 22 is also formed by a P-type impurity region, with a gate electrode 40 formed on the diffusion layer 38, with a gate insulating film 34 interposed therebetween. The P-type MOS capacitor 22 is formed by the diffusion layer 38 and the gate electrode 40, and the diffusion layer 38 of the P-type MOS capacitor 22 is connected to a power source line, and the gate electrode 40 is connected to a ground line. A circuit diagram of the P-type MOS capacitor 22 portion is shown in FIG. 4A, and an equivalent circuit of the P-type MOS capacitor 22 portion is shown in FIG. 4C.

In the P well 26, N-type impurity regions are formed by an N-type impurity implanted at high concentration, these forming a source 42 and a drain 44 of the N-type MOS-FET 20. There is a channel region between the source 42 and the drain 44 of the N-type MOS-FET 20, and a gate electrode 46 for controlling current flowing in the channel region is formed on the channel region, with a gate insulating film 34 interposed therebetween. The source 42 of the N-type MOS-FET 20 is connected to a ground line, the drain 44 is connected to the drain of the facing P-type MOS-FET 18, and the gate electrode 46 is connected to the gate electrode of the facing P-type MOS-FET 18.

Figure 4D:
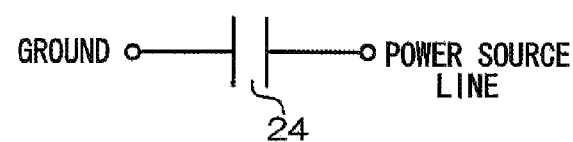
FIG. 4D is an equivalent circuit of an N-type MOS capacitor portion.

A diffusion layer 48 of the N-type MOS capacitor 24 is also formed by an N-type impurity region, and a gate electrode 50 is provided on the diffusion layer 48, with a gate insulating film 34 interposed therebetween. The N-type MOS capacitor 24 is formed by the diffusion layer 48 and the gate electrode 50, and the diffusion layer 48 of the N-type MOS capacitor 24 is connected to a ground line, and the gate electrode 50 is connected to a power source line. A circuit diagram of the N-type MOS capacitor 24 portion is shown in FIG. 4B, and an equivalent circuit of the N-type MOS capacitor 24 portion is shown in FIG. 4D.

Between each element, preferably separation is made by an element isolation region 52.

Contacts 54, for connecting the respective gate electrodes 40, 50 and diffusion layers 38, 48 to the power source lines and ground lines, are disposed in the P-type MOS capacitors 22 and the N-type MOS capacitors 24 so as not to be superimposed on each other. Plural of the contacts 54 may be provided for a single MOS capacitor in order to reduce contact resistance.

Figure 5:
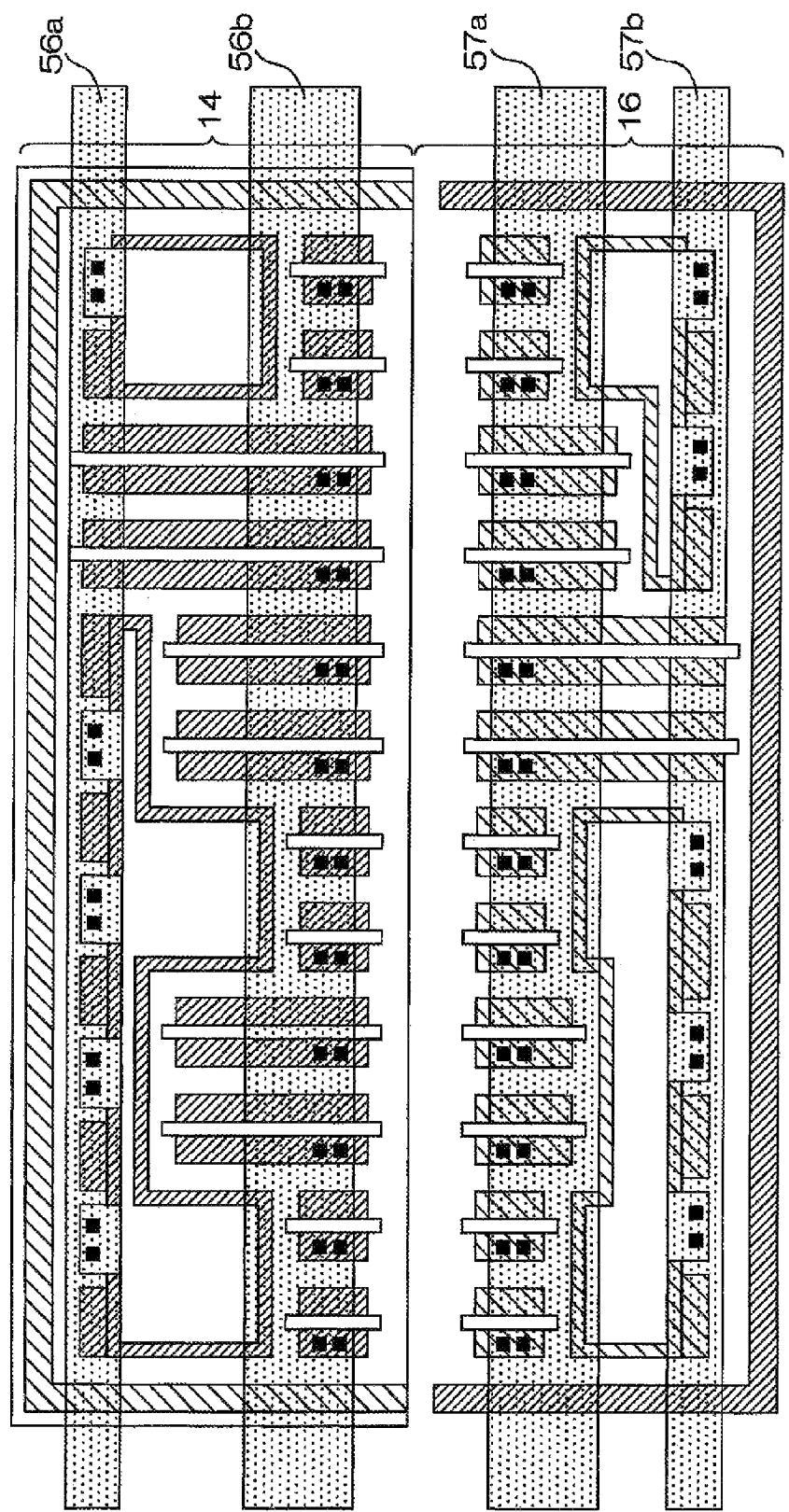
FIG. 5 is a plan view showing an outline of a single functional block of a semiconductor device according to the first exemplary embodiment.

Furthermore, in the semiconductor device 10 of the first exemplary embodiment, as shown in FIG. 5, ground lines 56a, 57a and power source lines 56b, 57b can be laid along horizontal direction regions on respective regions of the PMOS region 14 and the NMOS region 16.

When, as in a conventional semiconductor device, power source lines are laid at one end of a functional block and ground lines are laid at the other end thereof, connections between the P-type MOS capacitors 22 and the N-type MOS capacitors 24 and the power source lines and the ground lines need to be laid straddling CMOS portions, parasitic resistance becomes large due to the extending wiring layout, reducing the effect of the decoupling capacitors. However, in the semiconductor device 10 of the present exemplary embodiment, due to the gate electrodes 40 of the P-type MOS capacitors 22 being connected to the ground line 56a through the contacts 54, the diffusion layers 38 of the P-type MOS capacitors 22 being connected to the power source line 56b through the contacts 54, the diffusion layers 48 of the N-type MOS capacitors 24 being connected to the ground line 57a through the contacts 54, and the gate electrodes 50 of the N-type MOS capacitors 24 being connected to the power source line 57b through the contacts 54, there is no extending wiring layout. Wiring of the P-type MOS-FETs 18 and the N-type MOS-FETs 20 can also be simplified.

As explained above, according to the semiconductor device of the first exemplary embodiment, due to the P-type MOS capacitors and the N-type MOS capacitors being disposed in the functional block in regions thereof not disposed with the P-type MOS-FETs and the N-type MOS-FETs, the decoupling capacitance can be secured without increasing the surface area of the semiconductor device. By disposing the power source lines and the ground lines over each of the respective regions of the PMOS region and the NMOS region, a reduction in the decoupling capacitance effect, due to an increase in parasitic resistance due to an extending wiring layout, can be prevented.

Next, explanation follows regarding a layout method of a semiconductor device of the first exemplary embodiment. In order to simplify explanation, only the PMOS region 14 of the functional block 12 is shown here, and explanation is given regarding a case disposed with three individual P-type MOS-FETs 18.

Figure 6A:
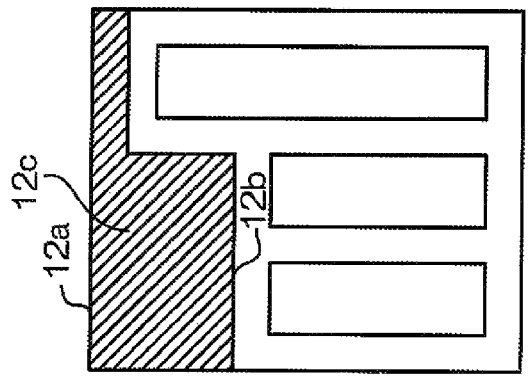
FIG. 6A to FIG. 6C are diagrams for explaining a layout method of a semiconductor device according to the present exemplary embodiment.

First, as shown in FIG. 6A, the placement position and shape of the P-type MOS-FETs 18 are decided, and laid out, such that CMOS integrated circuits formed by the P-type MOS-FETs 18 and the N-type MOS-FETs 20 are formed within a frame 12a designating a specific region where element placement is possible within the functional block 12.

Figure 6B:
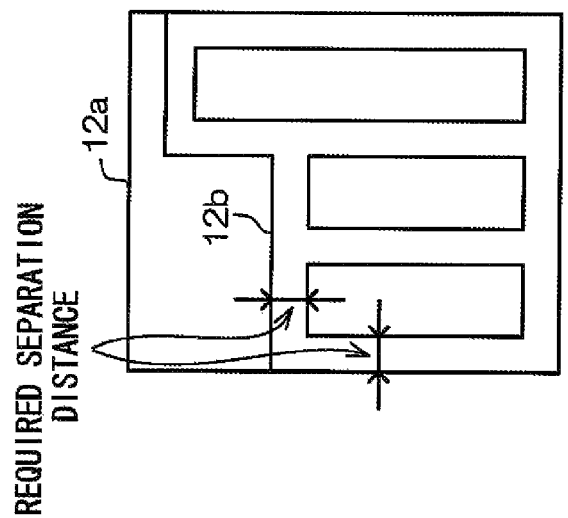
Figure 6C:
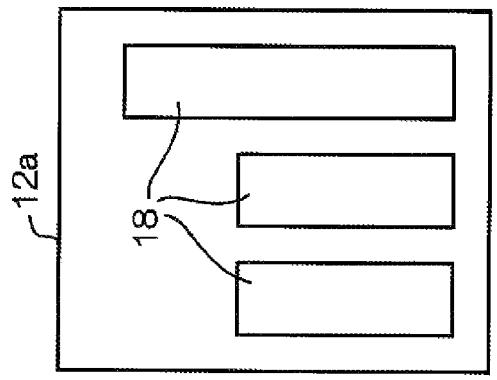

Next, as shown in FIG. 6B, an outline contour 12b is drawn at the outside of the P-type MOS-FETs 18, at a required separation distance from the outline contour of the P-type MOS-FETs 18. Note that the required separation distance is the separation distance required between one element and another element such that the elements are not too close to each other and such that there is no shorting therebetween. Then, as shown in FIG. 6C, an empty region 12c surrounded by the outline contour 12b of the P-type MOS-FETs 18 and the frame 12a is decided as the placement position of the P-type MOS capacitor 22, and the shape of the empty region 12c is determined as the shape of the P-type MOS capacitor 22. Layout is also made in a similar manner for the N-type MOS capacitor 24.

A computer configured including a CPU, ROM, and RAM can be employed, a layout program according to the layout method described above stored on the ROM, such that processing according to the above layout method can be executed by the CPU executing the layout program.

Explanation follows regarding a method of fabricating a semiconductor device of the first exemplary embodiment.

Figure 7A:
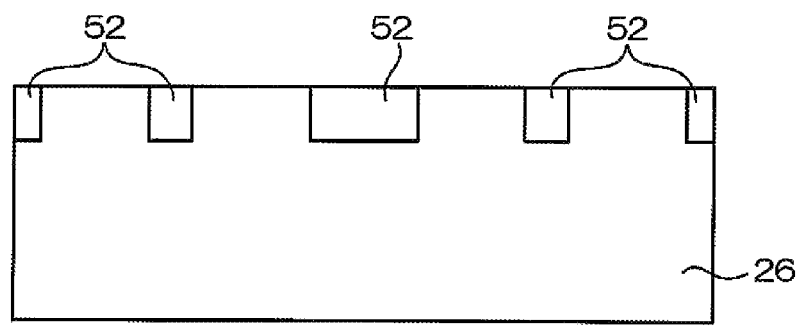
FIG. 7A to FIG. 7D are diagrams for explaining a method of fabricating a semiconductor device according to the present exemplary embodiment.

First, as shown in FIG. 7A, trenches are cut in a substrate (P well) 26 diffused with a P-type impurity, in regions corresponding to between elements, according to a layout produced by the layout method of the semiconductor device described above, and an insulating material is embedded therein, forming element isolation regions 52.

Figure 7B:
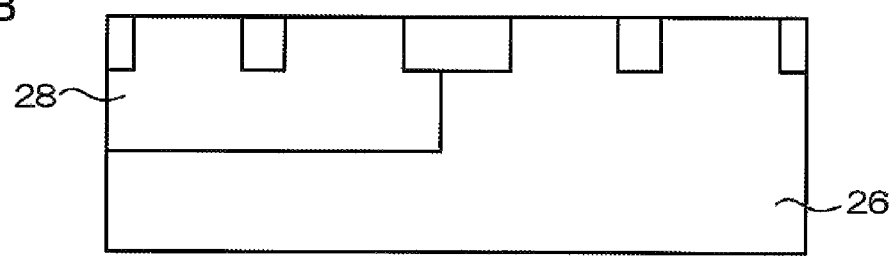

Next, as shown in FIG. 7B, localized ion implantation is performed in a portion of the P well 26 that is to become the PMOS region 14, forming an N well 28.

Figure 7C:
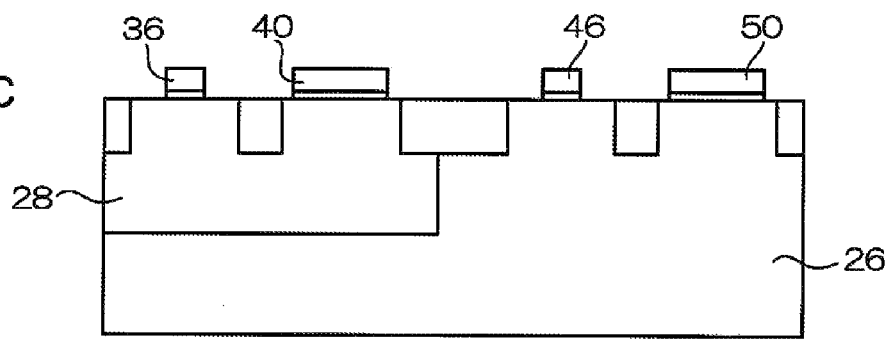

Next, an oxidized film is formed on the substrate surface, etching is carried out using a photoresist with the pattern of the gate electrodes 36, 40, 46, 50 as a mask, and the gate electrodes 36, 40, 46, 50 are formed, as shown in FIG. 7C.

Figure 7D:
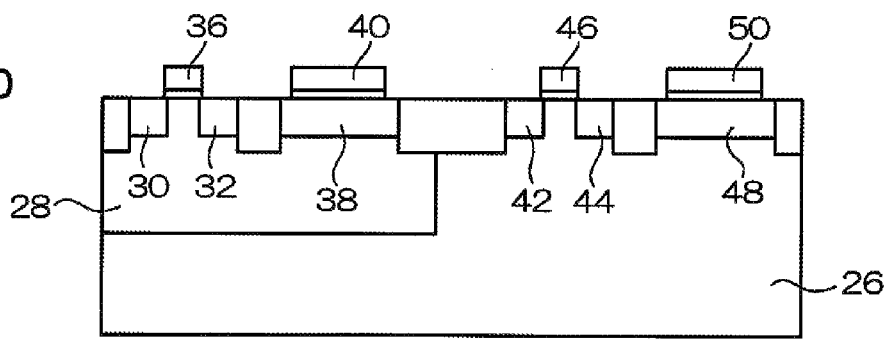

Next, as shown in FIG. 7D, with the NMOS region 16 masked with a photoresist, a P-type impurity is implanted at high concentration in order to form the source 30 and the drain 32 of the P-type MOS-FET 18, and the diffusion layer 38 of the P-type MOS capacitor 22. Then, in a similar manner, with the PMOS region 14 masked with a photoresist, an N-type impurity is implanted at high concentration in order to form the source 42 and the drain 44 of the N-type MOS-FET 20 and the diffusion layer 48 of the N-type MOS capacitor 24.

As explained above, according to the method of fabricating the semiconductor device of the present exemplary embodiment, P-type MOS-FETs and N-type MOS-FETs can be formed as logic circuit elements, and P-type MOS capacitors and N-type MOS capacitors can be formed as decoupling capacitors.

Note that while explanation has been given above of a case employing a substrate (P well) diffused with a P-type impurity, a substrate (N well) diffused with an N-type impurity may also be employed. In such cases, localized ion implantation may be made in a portion of the N well that is to become an NMOS region, so as to form a P well.

Next, explanation follows regarding an semiconductor device of a second exemplary embodiment. As shown in FIG. 1, plural individual functional blocks 212 are also provided as each functional unit to a semiconductor device 210 of the second exemplary embodiment.

Figure 8:
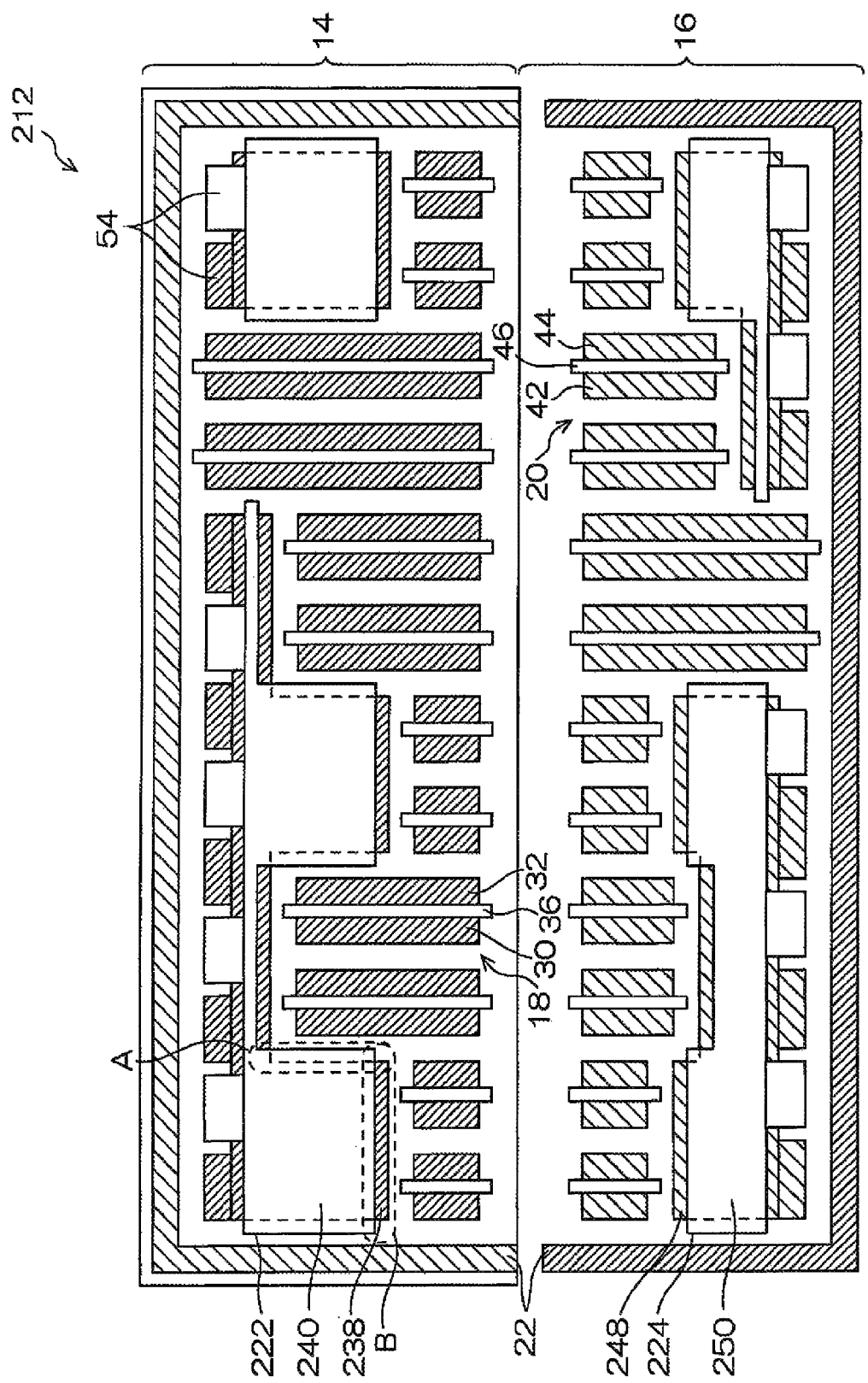
FIG. 8 is plan view of an outline of a single functional block of a semiconductor device of a second exemplary embodiment.

FIG. 8 shows a plan view of one of the functional blocks 212 of the semiconductor device 210 of the second exemplary embodiment. Note that similar configurations to those of the semiconductor device 10 of the first exemplary embodiment are allocated the same reference numerals and explanation thereof is abbreviated.

A P-type MOS capacitor 222 is disposed at a required separation distance, such that the elements are not too close to each other and there is no shorting therebetween, from P-type MOS-FETs 18. Generally, the required separation distance between a gate electrode and an impurity region is smaller than the required separation distance between two gate electrodes or between two impurity regions. The gate electrodes 240 or the diffusion layers 238 are spread out up to the point where the required separation distance threshold is reached, respectively, at facing portions of two gate electrodes or two impurity regions, and at facing portions between a gate electrode and an impurity region.

Specifically, in a facing portion (the portion surrounded by the intermittent line A in the figure) of the P-type MOS capacitor 222 to an impurity region (the source 30 or the drain 32) of one of the P-type MOS-FETs 18, the gate electrode 240 is formed so as to project out further to the P-type MOS-FETs 18 side than the diffusion layer 238. Also, at a facing portion (the portion surrounded by the intermittent line B in the figure) of the P-type MOS capacitor 222 to the gate electrode 36 of the P-type MOS-FET 18, the diffusion layer 238 is formed so as to project out further to the P-type MOS-FET 18 side than the gate electrode 240.

Similarly, with N-type MOS capacitors 224 too, at the facing portion of the N-type MOS capacitor 224 to an impurity region (the source 42 or the drain 44) of one of the N-type MOS-FETs 20, the gate electrode 250 is formed so as to project out further to the N-type MOS-FET 20 side than the diffusion layer 248. In the facing portions of the N-type MOS capacitor 224 to the gate electrode 46 of one of the N-type MOS-FETs 20, the diffusion layer 248 is formed so as to project out further to the N-type MOS-FET 20 side than the gate electrode 250.

As explained above, according to the semiconductor device of the second exemplary embodiment, the surface area of the MOS capacitor can be increased to the maximum while preventing the gate electrodes and the impurity regions from getting too close to each other and shorting between elements, and decoupling capacitance can be more effectively secured.

Note that the semiconductor device layout method and the method of fabricating a semiconductor device described above can also be applied to the semiconductor device of the second exemplary embodiment.

Whilst explanation has been given in the above exemplary embodiments of cases regarding semiconductor devices in which CMOS integrated circuits are formed as logic circuits, there is no limitation thereto, and any configuration may be made in which a decoupling capacitor is disposed in a region within a functional block where there is no logic circuit element disposed.

What is claimed is:

1. A semiconductor device comprising:
   logic circuit elements disposed within a specific region in respective functional blocks of a logic circuit having a plurality of the functional blocks provided one for each functional unit; and
   a decoupling capacitor disposed in a region within each of the functional blocks at which no logic circuit element is disposed, wherein the functional blocks are partitioned along a first direction into a PMOS region where P-type MOS elements are disposed as the logic circuit elements, and an NMOS region where N-type MOS elements are disposed as the logic circuit elements, and the P-type MOS elements and the N-type MOS elements are disposed so as to face each other along a second direction orthogonal to the first direction, wherein the decoupling capacitor is formed by a gate electrode and an impurity region facing the gate electrode, and a P-type MOS capacitor is disposed in the PMOS region, and an N-type MOS capacitor is disposed in the NMOS region, wherein, in a facing portion of the P-type MOS capacitor to an impurity region of one of the P-type MOS elements, the gate electrode constituting the P-type MOS capacitor is formed so as to project out further to the P-type MOS element side than the impurity region facing the gate electrode, wherein, in a facing portion of the P-type MOS capacitor to the gate electrode of the P-type MOS element, the impurity region facing the gate electrode constituting the P-type MOS capacitor is formed so as to project out further to the P-type MOS element side than the gate electrode, wherein, in a facing portion of the N-type MOS capacitor to an impurity region of one of the N-type MOS elements, the gate electrode constituting the N-type MOS capacitor is formed so as to project out further to the N-type MOS element side than the impurity region facing the gate electrode, and wherein, in a facing portion of the N-type MOS capacitor to the gate electrode of the N-type MOS element, the impurity region facing the gate electrode constituting the N-type MOS capacitor is formed so as to project out further to the N-type MOS element side than the gate electrode.

2. The semiconductor device of claim 1, wherein the decoupling capacitor is shaped to correspond to an outline contour of the logic circuit elements, shaped to correspond to an outline contour designating the region of each of the functional blocks, or shaped with a portion corresponding to the outline contour of the logic circuit elements and a portion corresponding to the outline contour of the region of each of tile functional blocks.

3. The semiconductor device of claim 1, wherein a plurality of the P-type MOS elements of a plurality of sizes are disposed in the PMOS region, and a plurality of the N-type MOS elements of a plurality of sizes are disposed in the NMOS region.

4. The semiconductor device of claim 1, wherein a ground line and a power source line extend along the first direction over the PMOS region and over the NMOS region, respectively, and the decoupling capacitor is connected to the ground line and to the power source line over each of the corresponding regions.

* * * * *